United States Patent
Sako (10) Patent No.: US 9,863,995 B2
(45) Date of Patent: Jan. 9, 2018

(54) ANTENNA-AND-CABLE CONNECTION-STATE VERIFICATION DEVICE AND VERIFICATION METHOD

(71) Applicant: Hiroshi Sako, Tokyo (JP)

(72) Inventor: Hiroshi Sako, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 50 days.

(21) Appl. No.: 14/434,786

(22) PCT Filed: Jan. 8, 2013

(86) PCT No.: PCT/JP2013/050060
§ 371 (c)(1),
(2) Date: Apr. 10, 2015

(87) PCT Pub. No.: WO2014/108991
PCT Pub. Date: Jul. 17, 2014

(65) Prior Publication Data
US 2015/0285849 A1    Oct. 8, 2015

(51) Int. Cl.
*G01R 31/04*        (2006.01)
*G01R 35/00*        (2006.01)
(Continued)

(52) U.S. Cl.
CPC ....... *G01R 31/045* (2013.01); *G01R 27/2605* (2013.01); *G01R 31/1254* (2013.01); *G01R 35/00* (2013.01)

(58) Field of Classification Search
CPC .. G01R 31/045; G01R 31/1254; G01R 35/00; G01R 27/2605; G01R 31/04
(Continued)

(56) References Cited

U.S. PATENT DOCUMENTS 3,100,893 A * 8/1963 Brueckmann .......... H01Q 9/145
                                                        333/32
4,173,736 A    11/1979 Adams
(Continued)

FOREIGN PATENT DOCUMENTS

JP    A-4-25775        1/1992
JP    7-301657 A       11/1995
(Continued)

OTHER PUBLICATIONS

Amin, Emran Md, and Nemai Karmakar. "Partial discharge monitoring of High Voltage equipment using chipless RFID sensor." Asia-Pacific Microwave Conference 2011. IEEE, 2011.*
(Continued)

*Primary Examiner* — Jermele M Hollington
*Assistant Examiner* — Christopher McAndrew
(74) *Attorney, Agent, or Firm* — Buchanan Ingersoll & Rooney PC (57) ABSTRACT

A penetration terminal for connecting the coaxial cables inside and outside of the apparatus thereto is attached on the electric apparatus' frame, and the measurement of a combined capacitance of the antenna and the coaxial cable in the inner side of the apparatus is made possible from the outer side of the apparatus, so that it is possible to perform at any time the determination whether a wiring connection of the antenna mounted in the inner side of the electric apparatus is appropriate.

10 Claims, 8 Drawing Sheets

(51) Int. Cl.
*G01R 31/12* (2006.01)
*G01R 27/26* (2006.01)

(58) Field of Classification Search
USPC ........................................................ 324/538
See application file for complete search history.

(56) References Cited

U.S. PATENT DOCUMENTS

| | | | | |
|---|---|---|---|---|
| 4,764,773 | A * | 8/1988 | Larsen ................. | H01Q 1/1285 333/25 |
| 5,557,290 | A * | 9/1996 | Watanabe ............ | H01Q 1/1285 343/713 |
| 5,734,355 | A * | 3/1998 | Watanabe ............ | H01Q 1/1285 333/25 |
| 6,008,658 | A * | 12/1999 | Suyama ................. | G01N 22/02 324/637 |
| 6,215,449 | B1 * | 4/2001 | O'Neill, Jr. .......... | H01Q 1/1264 333/24 C |
| 6,333,715 | B1 * | 12/2001 | Kato ................... | G01R 31/1272 324/536 |
| 6,445,872 | B1 | 9/2002 | Sano et al. | |
| 8,368,604 | B2 * | 2/2013 | Cho ................... | G01R 29/0821 324/359 |
| 2006/0290578 | A1 * | 12/2006 | Wang ....................... | H01Q 9/42 343/702 |
| 2007/0026796 | A1 * | 2/2007 | Mizushina ............. | H04B 13/02 455/40 |
| 2011/0021069 | A1 * | 1/2011 | Hu ....................... | H01B 11/203 439/578 |
| 2012/0007788 | A1 * | 1/2012 | Hung ....................... | H01Q 9/20 343/851 |
| 2014/0184241 | A1 * | 7/2014 | Ho ..................... | G01R 29/0871 324/602 |

FOREIGN PATENT DOCUMENTS

| | | |
|---|---|---|
| JP | 8-019170 A | 1/1996 |
| JP | 11-064432 A | 3/1999 |
| JP | 2002-299946 A | 10/2002 |
| JP | 3348522 B2 | 11/2002 |
| JP | 2008-286715 A | 11/2008 |
| WO | WO 98/53334 A1 | 11/1998 |

OTHER PUBLICATIONS

Ju, Tang, et al. "GIS partial discharge quantitative measurements using UHF microstrip antenna sensors." 2007 Annual Report-Conference on Electrical Insulation and Dielectric Phenomena. IEEE, 2007.*

International Search Report (PCT/ISA/210) dated Feb. 19, 2013, by the Japanese Patent Office as the International Searching Authority for International Application No. PCT/JP2013/050060.

Oct. 9, 2016 Chinese Office issued by SIPO in Chinese Application No. 201380069710.3 (with English translation).

The extended European Search Report dated Sep. 5, 2016, by the European Patent Office in corresponding European Patent Application No. 13870555.3-1568. (9 pages).

* cited by examiner

| CABLE TYPE | CABLE LENGTH (m) | CAPACITANCE (nF) * | | |
|---|---|---|---|---|
| | | CASE 1 | CASE 2 | CASE 3 |
| SEMI-RIGID | 2 | 0.23 (0.22) | 0.28 (0.25) | 0.05 (0.04) |
| | 3 | 0.33 (0.32) | 0.37 (0.36) | 0.04 (0.04) |
| | 5 | 0.53 (0.54) | 0.58 (0.58) | 0.05 (0.04) |
| | 7 | 0.68 (0.76) | 0.75 (0.79) | 0.07 (0.04) |
| GENERAL (FLEXIBLE) | 5 | 0.54 (0.54) | 0.61 (0.58) | 0.07 (0.04) |

*: VALUES IN THE PARENTHESES ( ) ARE CALCULATED ONES

ANTENNA-AND-CABLE
CONNECTION-STATE VERIFICATION
DEVICE AND VERIFICATION METHOD

BACKGROUND OF THE INVENTION

Field of the Invention

The present invention relates to, in a case in which an antenna for receiving partial discharge of an electric apparatus and a cable for transmitting a received signal are mounted in an electric apparatus, a device for verifying in an outer side of the electric apparatus a connection state of those antenna and coaxial cable, and to, using the device, a method of verifying in an outer side of the electric apparatus a connection state of an electric apparatus.

Description of the Related Art

An antenna for measuring partial discharge of an electric apparatus is usually mounted inside of the electric apparatus, namely, in the frame (inside of the frame), and performs signal transmission to a signal processing unit which is placed outside of the apparatus through coaxial cables. In this case, the electric apparatus is frequently operated being filled with air, a hydrogen gas, an SF6 gas, and the like in the apparatus for the purposes of cooling, insulating, soundproofing and the like, and being in a sealed state of the frame.

In addition, in order to increase reliability of insulation monitoring of an electric power apparatus, an electric power apparatus' insulation monitoring device is disclosed in which, in an insulation monitoring device having an antenna for receiving electromagnetic waves generated by partial discharge and a detection member of partial discharge being connected by way of the antenna and a cable, the presence or absence of abnormality of a transmission channel is verified by further using a testing impedance having a thermo-sensitive resistor and a high-frequency blocking coil (refer to Japanese Laid-Open Patent Publication No. H08-19170).

Moreover, in order to detect short circuiting and disconnection of a sensor for detecting electromagnetic waves emitted due to partial discharge of an electric apparatus and a cable connected to this sensor, there exists a device in which a DC power source, four resistors and a photocoupler are included (refer to Japanese Laid-Open Patent Publication No. H11-64432).

Problems to be Solved by the Invention

However, an antenna for measuring partial discharge is usually mounted inside of the electric apparatus, namely, inside of the frame, and performs signal transmission to a signal processing unit placed outside of the apparatus through coaxial cables; and in addition, the electric apparatus is frequently operated being filled with air, a hydrogen gas, an SF6 gas and the like in the apparatus for the purposes of cooling, insulating, soundproofing and the like, and being in a sealed state of the frame. For these reasons, conventionally, there arises a problem in that, during operations, it has not been possible to verify whether an antenna and a coaxial cable mounted inside of the apparatus are accurately wire-connected or not.

More particularly, when a cooling gas is circulating in the electric apparatus, a cable might be disconnected due to vibration and sliding of the cable, so that, in order to achieve increasing reliability of partial discharge measurement, it has been necessary to constantly verify connection states of the antenna and the cable inside of the apparatus.

In addition, in the device disclosed in Japanese Laid-Open Patent Publication No. H08-19170, a testing impedance is required to connect an antenna and a cable therebetween, so that it could not necessarily have arrived that the presence or absence of abnormality can be easily detected.

Furthermore, in the device disclosed in Japanese Laid-Open Patent Publication No. H11-64432, a bridge circuit or the like using a DC power source, a photocoupler and four resistors should be constituted so that short circuiting and disconnection of a cable is to be detected, so that it could not necessarily have arrived that the presence or absence of abnormality can be simply detected.

The present invention has been directed at solving these problems described above, and an object of the invention is to easily perform, from outside of the electric apparatus, the verification of the presence or absence of disconnection of an antenna and a coaxial cable mounted inside of the electric apparatus, namely, inside of the frame, or their connection whether they are appropriate.

SUMMARY OF THE INVENTION

Means for Solving the Problems

An antenna-and-cable connection-state verification device according to the present invention comprises an antenna mounted in an inner side of a frame of an electric apparatus, for receiving a signal generated due to partial discharge from the electric apparatus;

a first coaxial cable connected to the antenna in an inner side of the frame, for transmitting the signal received by the antenna;

a second coaxial cable placed in an outer side of the frame, for transmitting the signal received by the antenna;

a penetration terminal being attached on the frame to pass through the frame and connecting the first coaxial cable to the second coaxial cable, for transmitting the signal therethrough; and a detection unit for detecting the signal received by the antenna by way of the first coaxial cable, the penetration terminal and the second coaxial cable, wherein, by measuring, in an outer side of the frame, a combined capacitance of the antenna and the first coaxial cable mounted in an inner side of the frame, connection states of the antenna and the first coaxial cable are verified.

Effects of the Invention

According to the present invention, in an electric power apparatus' insulation monitoring device, a penetration terminal for connecting coaxial cables inside and outside of the apparatus thereto is attached on the electric apparatus' frame, and the measurement of a combined capacitance of an antenna and a coaxial cable is made possible from the outer side of the apparatus, so that it is possible to perform at any time the determination whether a wiring connection of the antenna mounted in the inner side of the electric apparatus is appropriate, becoming possible to achieve increasing reliability of partial discharge measurement, and consequently becomes possible to achieve increasing insulation monitoring performance of the electric power apparatus' insulation monitoring device.

BRIEF DESCRIPTION OF DRAWINGS

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Embodiment 1

Figure 1:
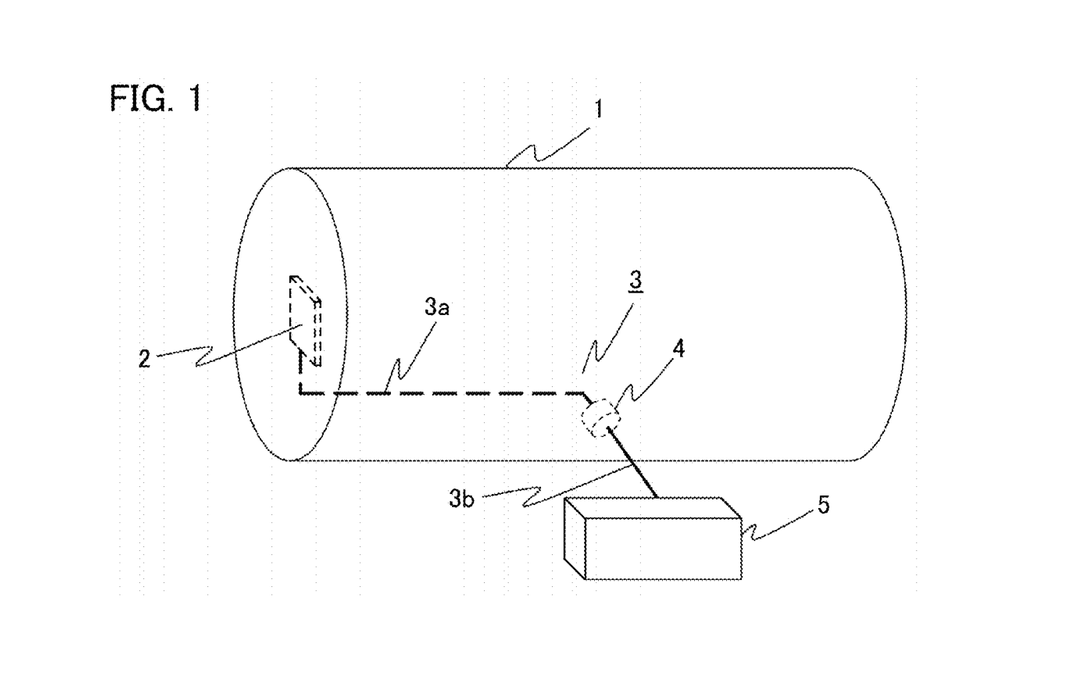
FIG. 1 is a diagram illustrating one example of a connection-state verification device for an antenna and a coaxial cable mounted on an electric apparatus according to Embodiment 1 of the present invention.

Hereinafter, the explanation will be made referring to FIG. 1 through FIG. 3 for one example of a connection-state verification device for an antenna and a coaxial cable mounted on an electric apparatus according to Embodiment 1 of the present invention. As illustrated in FIG. 1, the device is constituted of, in an electric apparatus frame 1 (inside of the electric apparatus), a microstrip antenna 2 that is one example of an antenna for measuring partial discharge from the electric apparatus; a coaxial cable 3a, inside of the apparatus, connected to this microstrip antenna 2; and a penetration terminal 4 attached on the electric apparatus frame (or manhole-cover, etc.), for connecting the coaxial cable 3a described above to a coaxial cable 3b provided outside of the electric apparatus frame 1; and is constituted of a detection unit 5 for detecting partial discharge of the electric apparatus received by the microstrip antenna 2 by way of the coaxial cables 3 and the penetration terminal 4.

Figure 2:
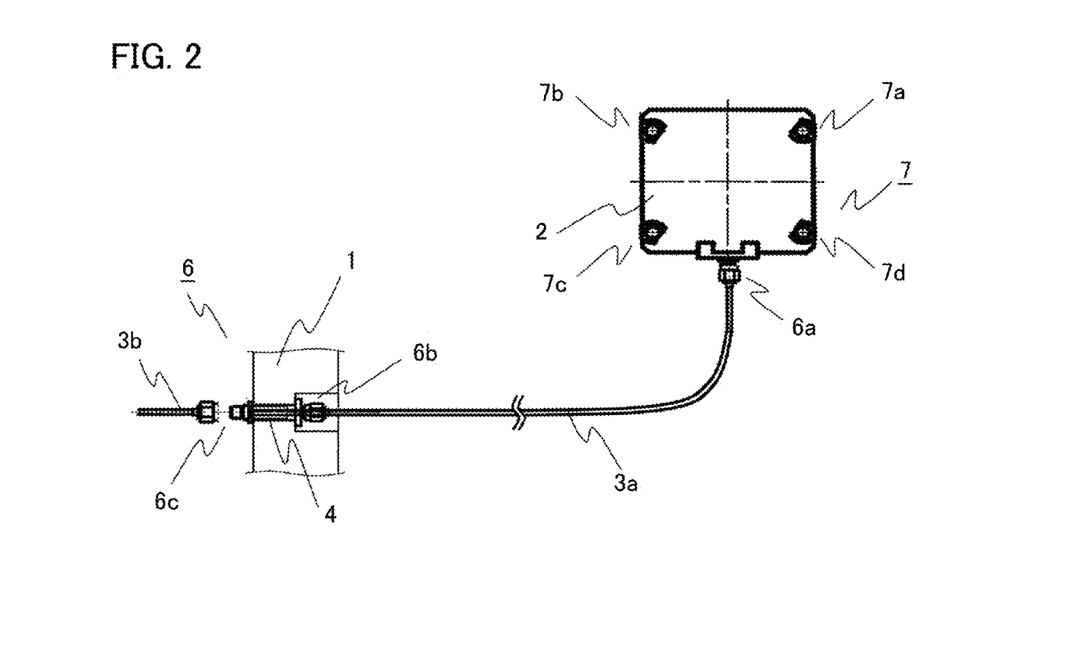
FIG. 2 is a diagram illustrating the principal part of the connection-state verification device for the antenna and the coaxial cable mounted on the electric apparatus according to Embodiment 1 of the present invention.

FIG. 2 is a diagram illustrating in more detail the principal part of the device illustrated in FIG. 1. As illustrated in FIG. 2, the microstrip antenna 2 is fixedly attached at the four corners thereof on the electric apparatus frame 1 by screws 7 or the like. This microstrip antenna 2 is connected by means of a connector 6a to the coaxial cable 3a inside of the electric apparatus frame (hereinafter also referred to "inside of the apparatus" for the sake of simplicity). In addition, this coaxial cable 3a is connected by means of a connector 6b to the penetration terminal 4 attached at a predetermined position of the electric apparatus frame 1, close to the aforementioned detection unit 5, but different from an attached position of the microstrip antenna 2 described above. Moreover, this penetration terminal 4 is connected by means of a connector 6c to the coaxial cable 3b outside of the electric apparatus frame (hereinafter referred to "outside of the apparatus" for simplicity). And then, this coaxial cable 3b is connected to the detection unit 5 described above.

According to the configuration described above, the verification that has been conventionally impossible from outside of the apparatus due to a hydrogen gas or SF6 gas filled in the apparatus becomes possible for a connection state and a state of abnormality of the antenna and coaxial cable mounted inside of the apparatus for measuring partial discharge.

To be specific, a signal received by the microstrip antenna mounted inside of the apparatus is transmitted by way of the connectors 6 and the coaxial cables 3 to the detection unit 5 placed outside of the apparatus. In this case, the microstrip antenna and the coaxial cable can be determined as two capacitors connected in parallel, so that, when a capacitance is measured from outside of the apparatus, a certain constant value is indicated.

However, when the coaxial cable is detached from the microstrip antenna, a capacitance becomes only that of the coaxial cable; and when the coaxial cable is disconnected, the capacitance changes in accordance with a disconnected location, because the capacitance is proportional to the length of cable. Therefore, by measuring the capacitance, a state(s) of the coaxial cable and the microstrip antenna inside of the apparatus can be known from outside of the apparatus.

Note that, in the description above, the explanation has been made for the case in which the antenna is that of the microstrip antenna. However, it is not limited to this; it is possible to achieve similar effects even in another antenna form having a capacitance.

Figure 3:
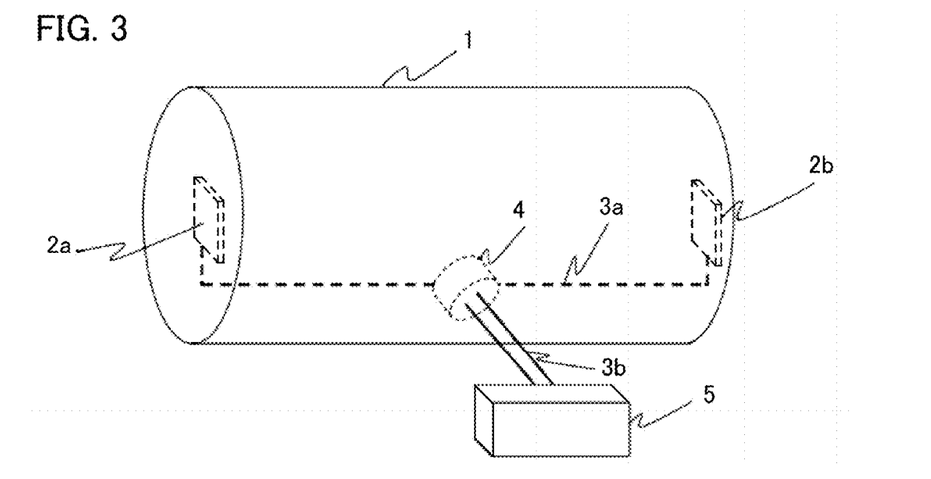
FIG. 3 is a diagram illustrating another example of a connection-state verification device for antennas and coaxial cables mounted on the electric apparatus according to Embodiment 1 of the present invention.

Meanwhile, FIG. 3 illustrates another example of a connection-state verification device for antennas and coaxial cables mounted on the electric apparatus according to Embodiment 1 of the present invention. In this example, the microstrip antennas 2 for measuring partial discharge from the electric apparatus, the coaxial cables 3a inside of the apparatus, and the coaxial cables 3b outside of the apparatus, different from those in FIG. 1 described above, are constituted in sets or groups of two. In this case, the two microstrip antennas are mounted inside of the electric apparatus frame described above at positions separated to each other. In the case according to the configuration described above, when generation of partial discharge occurs, the signal source of the partial discharge and the microstrip antenna are placed at positions separated to each other so that an interspace between a signal source of the partial discharge and the microstrip antenna is too large for the detection by one microstrip antenna; even in this case, a distance between the other microstrip antenna and the signal source of the partial discharge described above becomes in a detection range, so that the generation of the partial discharge can be detected, resulting in enhancing an effect of the present invention to become more significant. Similarly, three groups or four groups of those, i.e., a plurality of groups can be mounted.

Figure 4:
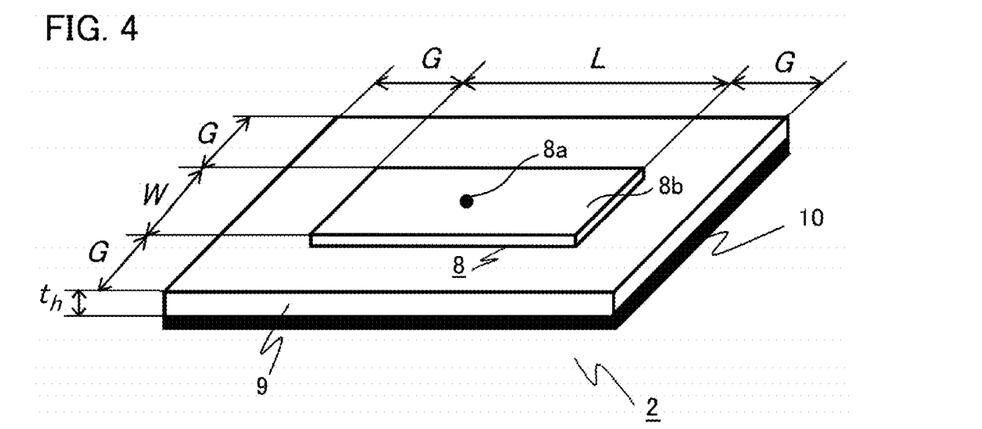
FIG. 4 is a model diagram illustrating a structure of a microstrip antenna mounted inside of the electric apparatus according to Embodiment 1 of the present invention.

For dealing therewith, the exemplary explanation will be made below by numeric values in which the method of the present invention is effective, referring to FIG. 4 through FIG. 7. First, FIG. 4 is a model diagram illustrating a structure of a microstrip antenna mounted inside of the electric apparatus according to Embodiment 1 of the present invention. In the figure, a voltage is supplied to the microstrip antenna 2 from a feeding point 8a on a strip conductor plate 8b of a flat-plate-shaped or planar strip conductor 8 with the length L and the width W. Being interposed between the strip conductor 8 and a planar ground plane 10, a planar dielectric material substrate 9 with the thickness $t_h$ and a dielectric constant $\in_r$ is placed. The dielectric material substrate 9 and the ground plane 10 are both planar with the length L+2G and the width W+2G, whereas the strip conductor 8 is placed at the central portion individually giving an interspace thereto by a quantity of G from planar vertical and horizontal end positions of the dielectric material substrate 9.

Figure 5:
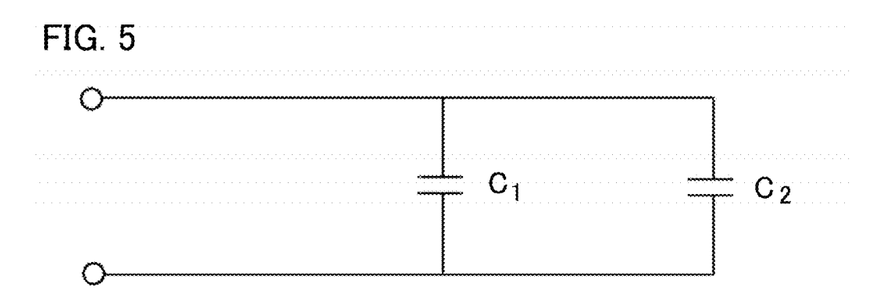
FIG. 5 is a model diagram of an equivalent circuit under consideration for the measurement, viewed from a penetration terminal according to Embodiment 1 of the present invention.

When the microstrip antenna 2 and the coaxial cable in the aforementioned configuration are electrically viewed from the penetration terminal, the coaxial cable is constructed by an inner conductor and an outer conductor whose cross-sections are concentrical, and thus can be determined as a capacitor $C_1$; the microstrip antenna is constructed as described above, and thus can be determined as a capacitor $C_2$ connected in parallel to the capacitor $C_1$ (refer to FIG. 5). At this time, a combined capacitance C of the microstrip antenna and the coaxial cable becomes equivalent to $C_1+C_2$.

Accordingly, an individual capacitance of the microstrip antenna and the coaxial cable is next estimated. First, by determining that the microstrip antenna illustrated in FIG. 4 is a simple parallel plate-capacitor, its capacitance is to be obtained. When W=L=49.6 mm, $t_h$=1.6 mm and $\in_r$=2.8, given as representative dimensions of the microstrip antenna, its capacitance is given as 0.038 (unit: nF).

The size L of the strip conductor 8 shown as described above is determined as will be described below. A frequency that is selectively received by the microstrip antenna is closely related to the size of the microstrip antenna. To be specific, in this microstrip antenna, when a detection frequency of partial discharge, namely, a resonance frequency of the microstrip antenna is $f_0$ (Hz), and the speed of light is c (m/s), a wavelength $\lambda_0$ (m) of an electromagnetic wave of the resonance frequency can be expressed by Equation (1).

$$\lambda_0 = \frac{c}{f_0} \quad (1)$$

At this time, the size L of the strip conductor 8 can be expressed by Equation (2).

$$L = \frac{\lambda_0}{2\sqrt{\varepsilon_r}} \quad (2)$$

Namely, the higher a measurement frequency is set at, the smaller the dimension of the microstrip antenna can be made; when the detection frequency is set two times, the dimension of the microstrip antenna becomes approximately ½.

Figure 6:
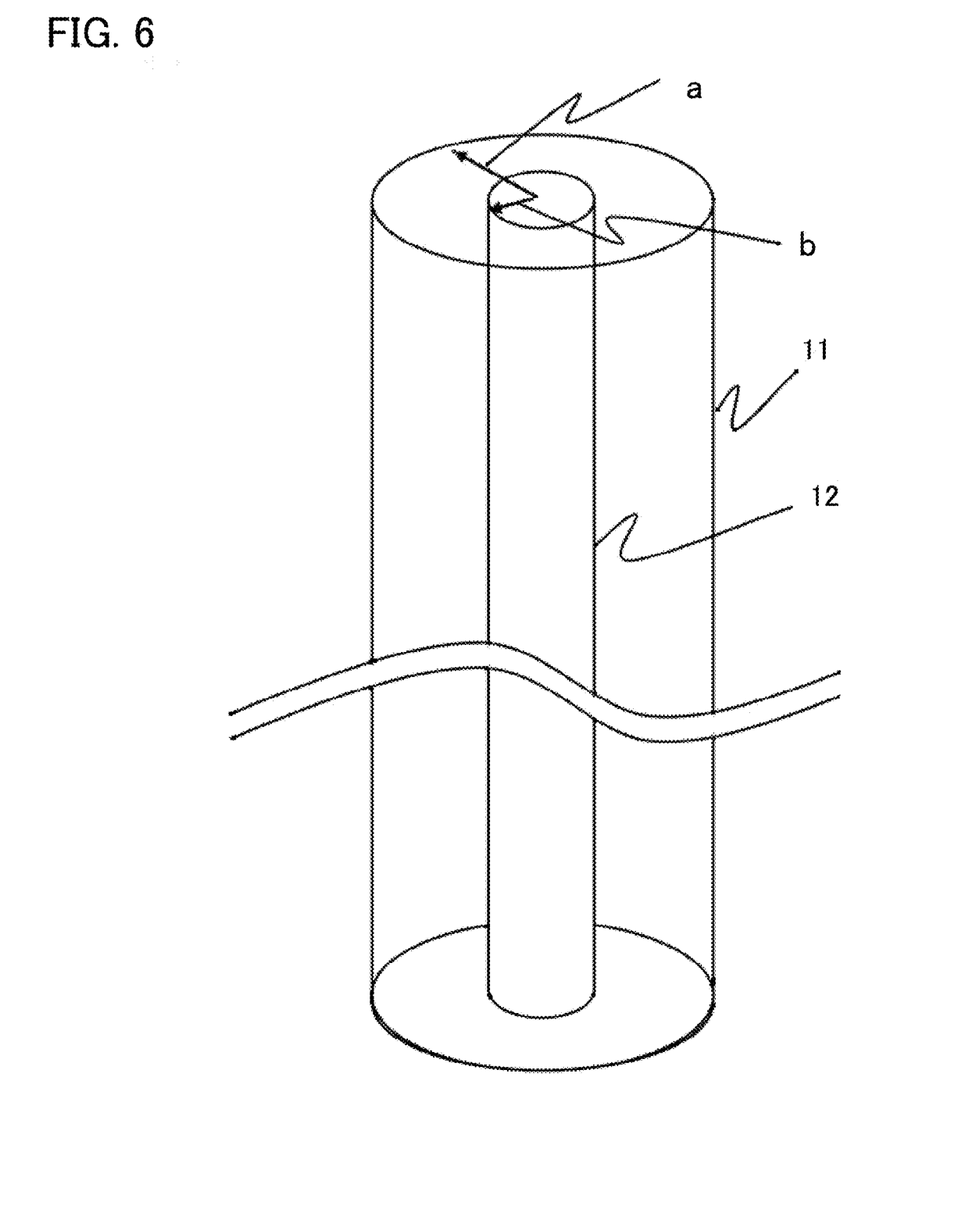
FIG. 6 is a coaxial cable's model diagram according to Embodiment 1 of the present invention.

Next, a capacitance of the coaxial cable is estimated. As a model for a structure of the coaxial cable, the one shown in FIG. 6 is presumed. In FIG. 6, the coaxial cable is presumed to constitute of a cylindrical outer conductor 11 made of copper with the radius a (m), and a columned inner conductor 12 made of copper with the radius b (m). When a dielectric constant of a dielectric material made of polyethylene or the like (not shown in the figure) between the inner conductor 12 and the outer conductor 11 is $\in_r$; permittivity of a vacuum, $\in_0$ (F/m); the amount of electric charge per 1 m of the inner conductor, Q (unit: C, coulomb); and a distance from the central axis of the inner conductor, r (m), then the strength of electric field E (V/m) between the inner conductor and the outer conductor can be expressed by Equation (3) in accordance with Gauss' theorem.

$$E = \frac{Q}{2\pi r \varepsilon_0 \varepsilon_r} \quad (3)$$

In addition, an electric potential V (V) of an inner conductor surface is expressed by Equation (4).

$$V = -\int_a^b E\,dr = -\frac{Q}{2\pi\varepsilon_0\varepsilon_r}\int_a^b \frac{1}{r}dr = -\frac{Q}{2\pi\varepsilon_0\varepsilon_r}[\ln r]_a^b = \frac{Q}{2\pi\varepsilon_0\varepsilon_r}\ln\frac{a}{b} \quad (4)$$

Furthermore, a capacitance $C_k$ (F/m) of the coaxial cable per 1 m can be expressed by Equation (5).

$$C_k = \frac{Q}{V} = \frac{2\pi\varepsilon_0\varepsilon_r}{\ln\frac{a}{b}} \quad (5)$$

Note that, the capacitance of the coaxial cable is proportional to a cable length.

Accordingly, the capacitance of the coaxial cable to be actually used is obtained next. As for the coaxial cable, it is generally taking place to cover the inner conductor made of a copper wire(s) by an insulation material (dielectric material) of polyethylene or the like and then to cover the surroundings by the outer conductor made of braided copper wire or the like, and thus to cover the surroundings by protective covering (sheath) of vinyl or the like. Other than this, a coaxial line, referred to as a semi-rigid type in which the outer conductor is a pipe made of copper and the insulation material is made of a fluorine-contained resin, is used for connections in the apparatus in mainly a UHF (Ultra High Frequency) band and an SHF (Super High Frequency) band. The latter coaxial cable cannot take on the bend radius significantly small, but has superior characteristics in a shielding characteristic, a low signal-attenuation characteristic, vibration-countermeasure stability, and the like.

Here, the explanation will be made below for an actually measured example in relation to a capacitance of a general coaxial cable illustrated in the model diagram of FIG. 6 described above. By taking a dielectric constant $\in_r$ as 2.1 (when the dielectric material is PTFE), the capacitance is given by Equation (3) described above. Using the actual measurement values of a=0.80 mm and b=0.27 mm, the capacitance is given as 0.108 (nF/m). Note that, also in the semi-rigid type, it may be understood that a value thereof is held close to the capacitance of the general coaxial cable as explained above.

Accordingly, the exemplary explanation will be next made for actual measurement values and calculated values of capacitances for the microstrip antenna and coaxial cables. Using the coaxial cables of semi-rigid type, when the cable lengths were 2 m, 3 m and 5 m, the actual measurement values of the coaxial cables alone were 0.23 (nF), 0.33 (nF) and 0.53 (nF), respectively. Meanwhile, when the calculated values corresponding to these were rounded off to two decimal places using the value 0.108 (nF/m) described above, the respective values were 0.22 (nF), 0.32 (nF) and 0.54 (nF), so that the actual measurement values and the calculated values showed in good coincidence with each other. In addition, when the general coaxial cable (cable length 5 m) was also used, the actual measurement value was 0.54 (nF); meanwhile, the calculated value was 0.54 (nF), and showed in good coincidence with each other. When these results are summarized, a value of capacitance in the coaxial cable alone is about 0.1 (nF/m), and it can be said that the actual measurement value and the calculated value are in good coincidence with each other. Therefore, when the cable is disconnected, the capacitance changes, so that it is possible to estimate the cable length from the actual measurement value, and thus it is possible to predict a disconnected location.

Next, when the capacitances were actually measured in a case in which the microstrip antenna is attached at a front end of the coaxial cable of semi-rigid type, the values were 0.28 (nF), 0.37 (nF) and 0.58 (nF), in the cases of the cable lengths 2 m, 3 m and 5 m, respectively. Meanwhile, the calculated values corresponding thereto were 0.25 (nF), 0.36 (nF) and 0.58 (nF), respectively; the actual measurement values and the calculated values were in good coincidence with each other. In addition, when the general coaxial cable (cable length 5 m) was used, the actual measurement value was 0.61 (nF); meanwhile, the calculated value was 0.58 (nF).

Figure 7:
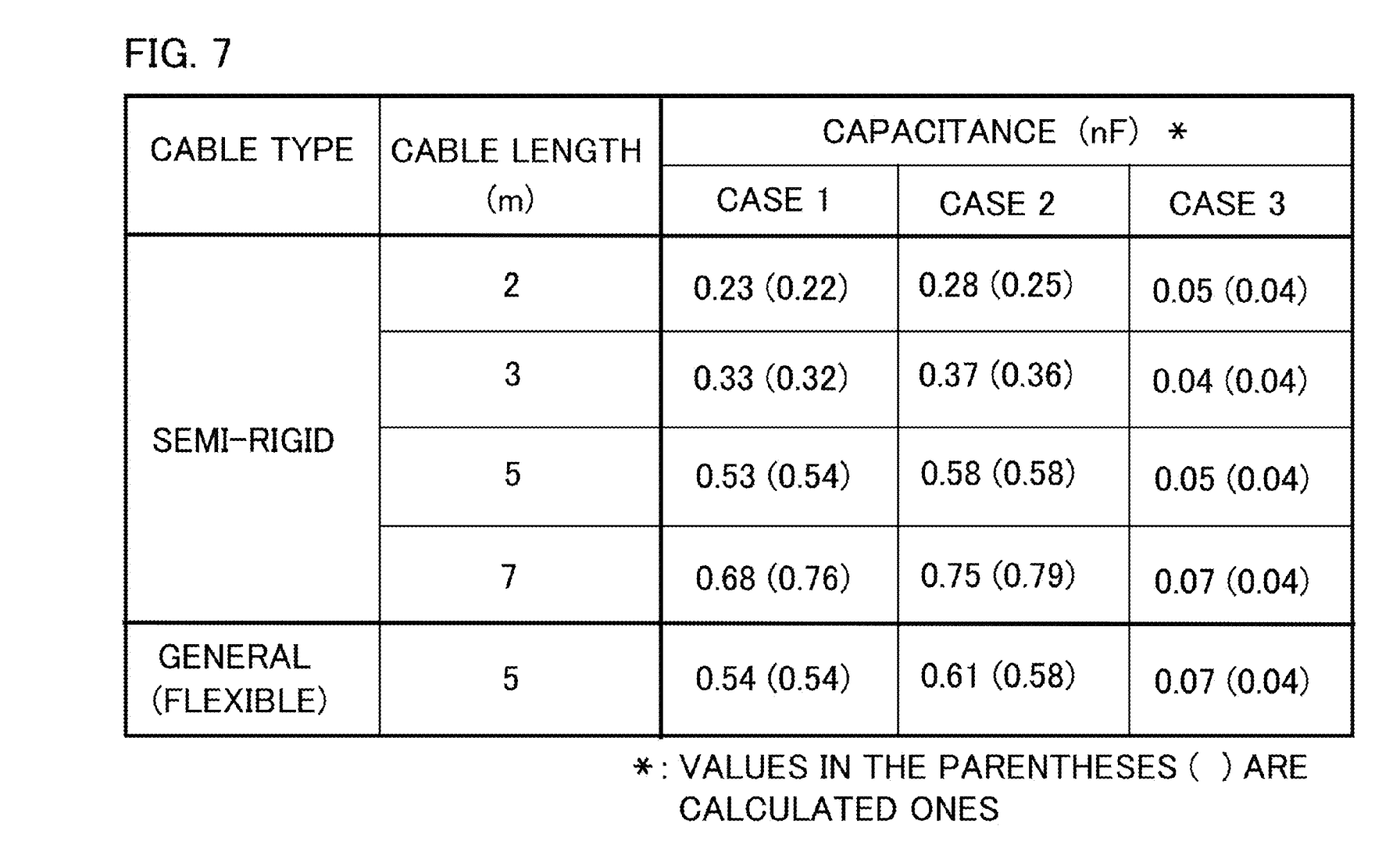
FIG. 7 is a diagram showing one example of actual measurement values and calculated values of capacitances for the microstrip antenna and coaxial cables according to Embodiment 1 of the present invention.

The results described above are summarized in the table as shown in FIG. 7. In this table, Case 1 indicates the actual measurement values and the calculated values of capacitances (calculated values in the parentheses) in the coaxial cable alone; Case 2, the actual measurement values and the calculated values of capacitances (calculated values in the parentheses) when the microstrip antenna is attached at a front end of the coaxial cable; and Case 3, the actual measurement values and the calculated values of capacitances (calculated values in the parentheses) derived from the results of Case 1 and Case 2 in the microstrip antenna alone. Accordingly, it can be understood that the microstrip antenna can be determined as a capacitor $C_2$ that is connected in parallel with the coaxial cable determined as a capacitor $C_1$, and that a combined capacitance C of these can be handled to be equal to "$C_1+C_2$."

Consequently, by comparing an actual measurement value measured by connecting the microstrip antenna at a front end of the coaxial cable with a combined capacitance obtained by calculation, it is possible to determine that the connection state is abnormal or not.

Moreover, when a cable length of the coaxial cable is large, for example, exceeding 7 m, a value of capacitance of the microstrip antenna becomes relatively small in comparison with that of capacitance of the coaxial cable, so that it is possible to perform the determination whether abnormal or not, by measuring a combined capacitance in an early stage in which it is reliably presumed that a state of wiring connections is normal, and by comparing the measured value as a reference with a later measured value. Furthermore, as another means, when a cable length of the coaxial cable is large, it is also possible to take countermeasures of using a value of capacitance of the microstrip antenna that is large in value relative to the value (0.038 nF) described above.

Figure 8A:
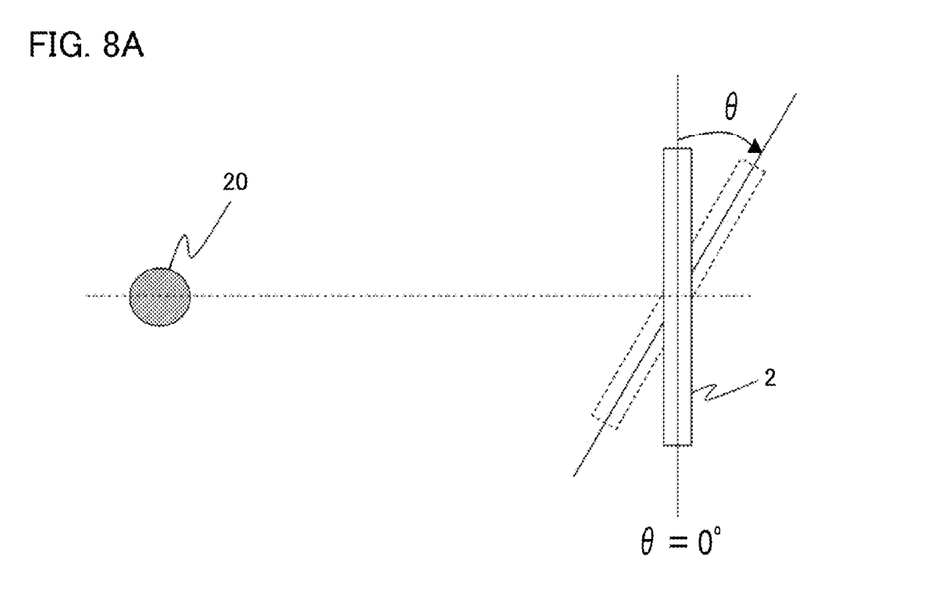
FIGS. 8A and 8B are diagrams for explaining directivity of the microstrip antenna according to Embodiment 1 of the present invention.
Figure 8B:
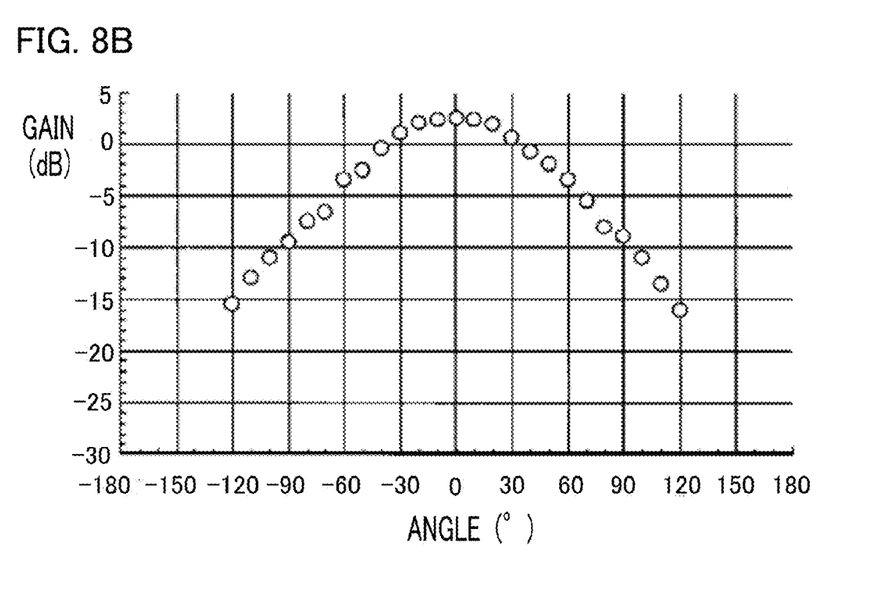

Note that, because the microstrip antenna has directivity with respect to a signal source 20, namely, a generation source of partial discharge from the electric apparatus as shown in FIGS. 8A and 8B, it is necessary to take notice when the measurement is performed. According to the document data (refer to FIG. 6 of Japanese Laid-Open Patent Publication No. 2008-286715), the gain is maximized when the antenna is placed at a position opposing to the signal source 20 (in a case of θ=0° in FIG. 8A), a high gain is obtained when the angle θ is in a range of 0°±20° (refer to FIG. 8B). Therefore, it is desirable to perform the measurement in the angle range.

Figure 9:
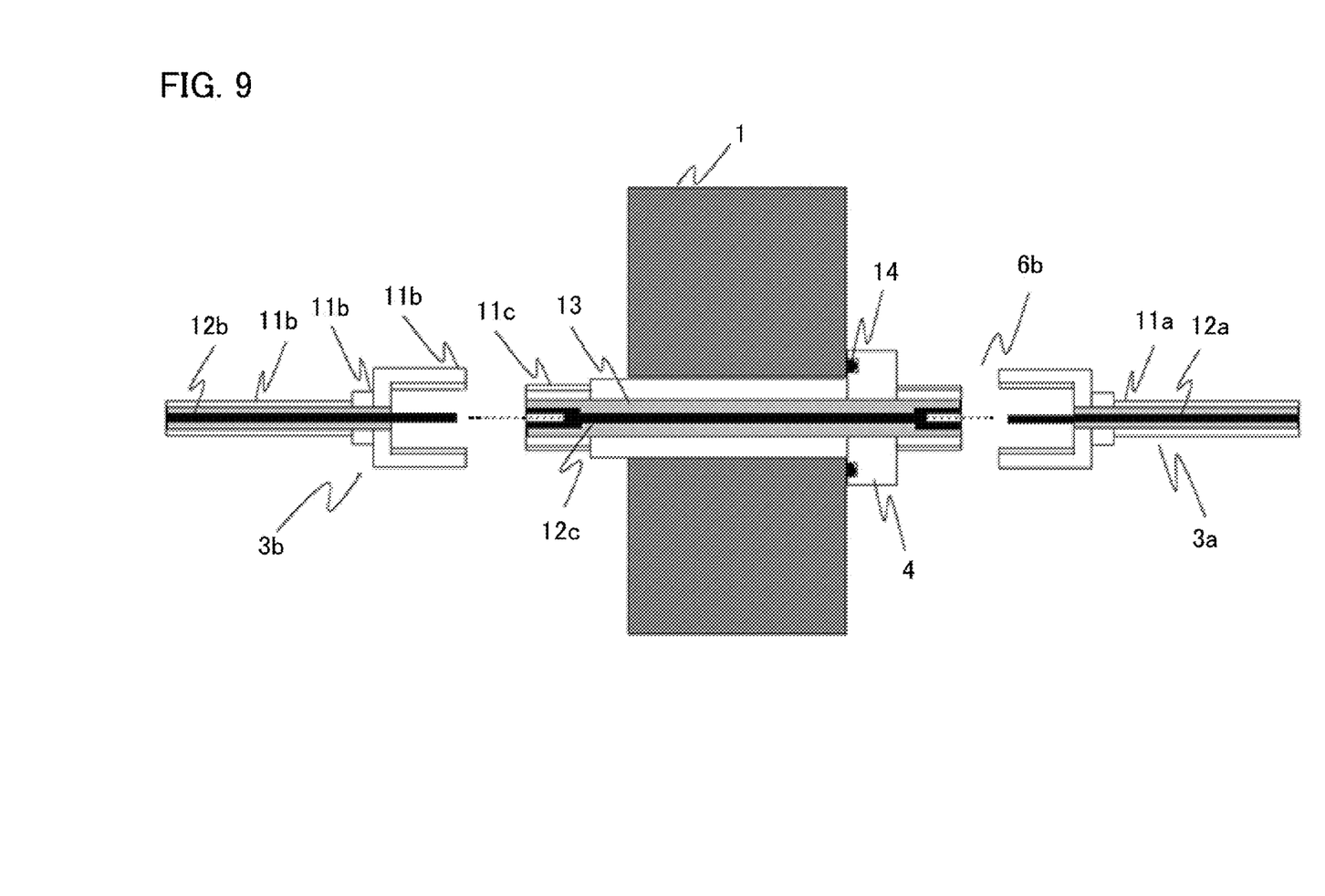
FIG. 9 is a detailed diagram for a configuration of the penetration terminal and the coaxial cables according to Embodiment 1 of the present invention.

Next, the explanation will be made in more detail for a structure of the penetration terminal and its connection method to coaxial cables referring FIG. 9. Because the electric apparatus is in general operated being filled with air, a hydrogen gas, an SF6 gas and the like in the apparatus for the purposes of cooling, insulating, soundproofing and the like, and being in a sealed state of the electric apparatus frame, it is necessary to attach the penetration terminal having hermetic sealing property as shown in FIG. 9 to the electric apparatus frame 1, and to connect the coaxial cable 3a inside of the apparatus to the coaxial cable 3b outside of the apparatus. The structure of the penetration terminal 4 takes a configuration of, from the center (central axis) as shown in FIG. 9, an inner conductor 12c, a dielectric material (also referred to as an insulation material) 13, and an outer conductor 11c. In addition, in the inner side of the apparatus to the penetration terminal, an O-ring 14 is placed to enhance the hermetic sealing property. Moreover, in order to connect the coaxial cables inside and outside of the apparatus to the penetration terminal, connectors or the like of a thread fit scheme are used. According to the manner described above, the inner conductors of the coaxial cables inside and outside of the apparatus are electrically connected, and the outer conductors of the coaxial cables inside and outside of the apparatus are also electrically connected. Because the inner conductor and the outer conductor of the penetration terminal are electrically insulated, the inner conductor and the outer conductor of the coaxial cables can maintain electrical insulation even when the coaxial cables are connected to the penetration terminal.

Note that, because the penetration terminal described above is in a structure having the inner conductor and the outer conductor of approximately concentrical cross-sections as illustrated in FIG. 9, the penetration terminal has a capacitance similar to those of the coaxial cables. However, because the length of the penetration terminal is usually less than 40 mm, the capacitance thereof is in the degree of ⅕₀ to the coaxial cable of 2 m. Therefore, in an actual capacitance measurement, the capacitance of the penetration terminal may be ignored. In addition, the measurement of combined capacitance is performed by connecting a commercially available digital multimeter or the like to a connector component of the penetration terminal in the outer side of the apparatus; when a capacitance of the coaxial cable mounted outside of the apparatus is comparatively small to that of the coaxial cable mounted inside of the apparatus, and also when the value of the latter is clear, the combined capacitance may be measured at an end of the coaxial cable outside of the apparatus.

Moreover, when the coaxial cables are mounted inside of the apparatus and outside of the apparatus, there arises a fear of damage to the cable if the bend radius of cable is made smaller, it should be avoided that the bend radius is made extremely small. In a case of the semi-rigid cable where an outer diameter of the coaxial cable is in the degree of 2 mm, it is preferable that the bend radius is set 30 mm or more.

Figure 10:
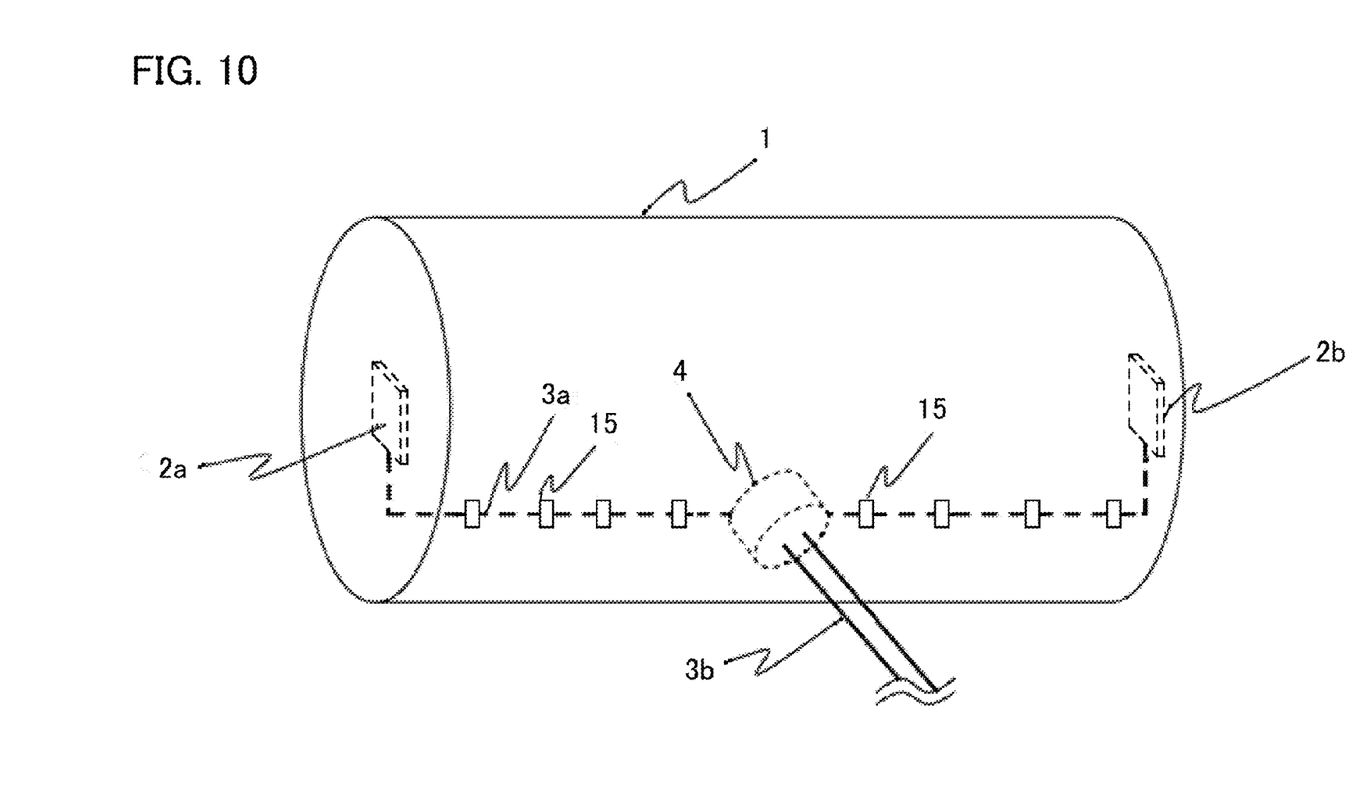
FIG. 10 is a diagram for explaining an attachment scheme of coaxial cables of the connection-state verification device for the antennas and the coaxial cables mounted on the electric apparatus according to Embodiment 1 of the present invention.

By the way, it is necessary to arrange that the coaxial cable inside of the apparatus connected to the microstrip antenna is wired, in order not to be erroneously disconnected during work or the like inside of the apparatus, along a frame shape of the electric apparatus, and is connected to the penetration terminal. In this case, when a gas filled inside of the electric apparatus' frame is circulating thereinside, the coaxial cable vibrates due to the circulation of the gas, and slides on the electric apparatus' frame, so that the coaxial cable might be disconnected. Accordingly, the coaxial cables inside of the apparatus are fixed on the frame, in 30-cm space-intervals as a guide, by cable supports 15 as illustrated in FIG. 10. Under this situation, connection abnormality such as a disconnection in the coaxial cable(s) can be prevented by enclosing the surroundings of the coaxial cables 3$a$ by a cushioning material made of porous cloth or the like impregnated by an epoxy resin or the like of natural hardening, so that the cable supports 15 and the coaxial cables 3$a$ do not directly contact with each other. The cable supports 15 described above are fixed on the electric apparatus' frame by welding or the like.

Embodiment 2

Figure 11:
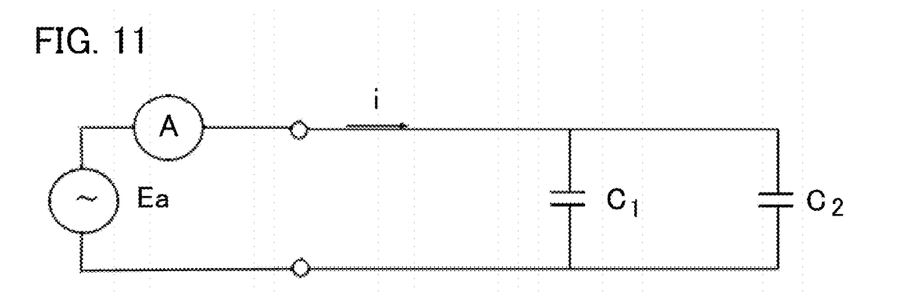
FIG. 11 is a model diagram of an equivalent circuit under consideration for the measurement according to Embodiment 2 of the present invention.

In Embodiment 1 described above, the explanation has been made for a method of detecting abnormality when the capacitances of the microstrip antenna and the coaxial cable are configured in parallel to have those respective capacitances as $C_2$ and $C_1$, and thus the combined capacitance C (its unit is F: farad) is measured, the combined capacitance C changes if a disconnection in the cable and/or fallout of the antenna occur. In Embodiment 2, the explanation will be made for a method of detecting abnormality referring to an equivalent circuit shown in FIG. 11. Namely in FIG. 11, an AC (alternating-current) voltage $E_a$ (its unit: V, hereinafter in a similar fashion) of a frequency f (its unit: Hz, hereinafter in a similar fashion) is supplied to this circuit, and an electric current i (its unit: A, hereinafter in a similar fashion) flowing therethrough is measured. At this time, it is necessary to make the frequency f set at a low frequency so that it becomes a lumped circuit constant, as shown by the equivalent circuit in FIG. 11. In this figure, a combined capacitance C (its unit: F) of $C_1$ and $C_2$ is given, which derives that: i=jωCE$_a$=j(2πfCE$_a$) (A), where "j" in the equations is the imaginary unit. When "C" changes due to a disconnection in the cable and/or fallout of the antenna, "i" also changes, so that it is possible to detect the abnormality.

Namely in Embodiment 2, by supplying an AC voltage $E_a$ (V) of a frequency f (Hz) through a terminator of the coaxial cable from the outer side of the apparatus, and by comparing an electric current i (A) flowing therethrough with a normal value, it is possible to verify the presence or absence of a disconnection in the cable, and connection states of the antenna and the coaxial cable from the outer side of the apparatus.

Embodiment 3

Figure 12A:
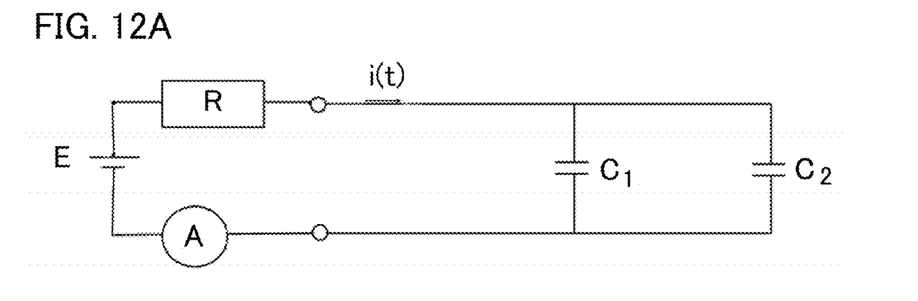
FIGS. 12A and 12B are model diagrams of an equivalent circuit under consideration for the measurement according to Embodiment 3 of the present invention.
Figure 12B:
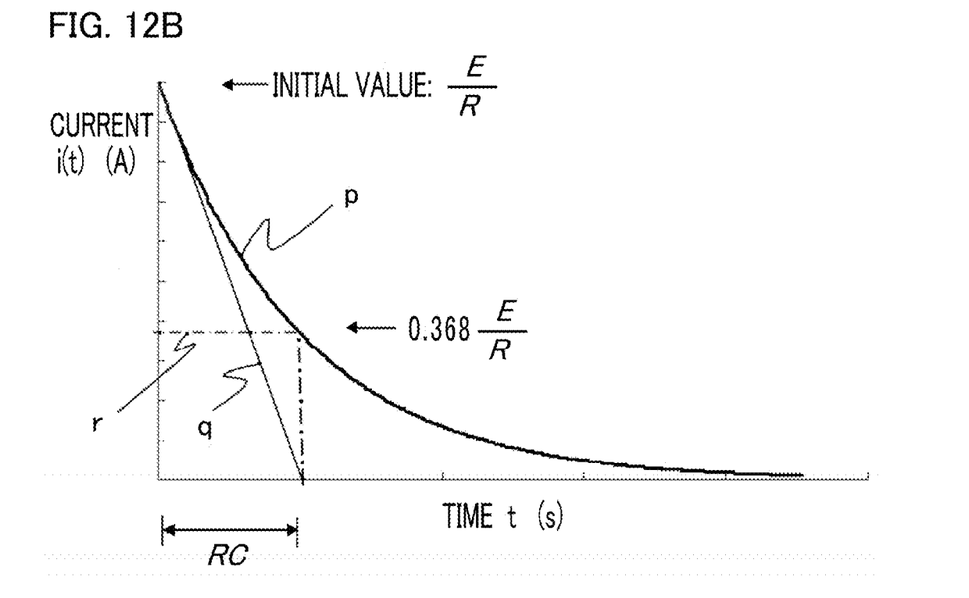

The explanation will be made for Embodiment 3 referring to FIGS. 12A and 12B. In Embodiment 3, as shown in FIG. 12A, a DC (direct-current) voltage E (V) is supplied to the circuit in place of the AC voltage $E_a$ (V) in Embodiment 2, and, by connecting a resistor R (its unit: Ω) and measuring a time constant of this circuit, a method of detecting abnormality of a cable and/or an antenna is achieved. In this case, when the capacitances of the microstrip antenna and the coaxial cable are to have those respective capacitances as $C_2$ and $C_1$, and thus the combined capacitance C (F) is given, next Equation (6) is held.

$$E = Ri(t) + \frac{1}{C}\int i(t)dt \tag{6}$$

By taking a Laplace transform of Equation (6), next Equation (7) is obtained.

$$I(s) = \frac{C}{RCs+1}E = \frac{E}{R}\left(\frac{1}{s+\frac{1}{RC}}\right) \tag{7}$$

By taking an inverse Laplace transform of Equation (7), next Equation (8) is obtained.

$$i(t) = \frac{E}{R}e^{-\frac{1}{RC}t} \tag{8}$$

From Equation (8) above, the time constant is RC (s: second). In this case, the time constant is obtained based on transient changes in the electric current as described above. As a scheme to obtain a specifically numeric value of the time constant, it may be adopted that, as the details will be stated below, a time is obtained when the electric current becomes 0.368 time ($=e^{-1}$) of an initial value, and it may be also adopted that a time is obtained when an initial gradient of the electric current, and the gradient intersects the time axis.

Namely in FIG. 12A, because an electric current i(t) (indicating that the electric current i is a function of time; hereinafter in a similar fashion) is expressed by Equation (8) (refer to the curve p in FIG. 12B), t=RC (equal to the time constant) is substituted into Equation (8), which derives that: i=E $e^{-1}$/R≅0.368 E/R (refer to the curve p, the straight line q and the straight line r in FIG. 12B). Therefore, in the actual measurement, when a time t is obtained from a graph (straight line r) in FIG. 12B at which the electric current i(t) becomes 0.368 time of an initial value, the time defines the time constant RC.

Meanwhile, the gradient of the electric current i(t), di(t)/dt, is expressed by next Equation (9).

$$\frac{di(t)}{dt} = \frac{d\left(\frac{E}{R}e^{-\frac{1}{RC}t}\right)}{dt} = -\frac{E}{R^2C}e^{-\frac{1}{RC}t} \tag{9}$$

Namely, an initial (t=0) gradient of the curve p is $-E/(R^2C)$ that is a value obtainable when t=0 is substituted into Equation (9). A line that gives E/R (equal to the initial value) as a value at t=0 in a straight line (the straight line q) having the gradient is expressed by next Equation (10).

$$i(t) = -\frac{E}{R^2C}t + \frac{E}{R} \quad (10)$$

According to this Equation (10), a value of t when i(t)=0, namely, a time when the straight line (refer to the straight line q in FIG. 12B) expressed by Equation (10) intersects the time axis is obtained as the time constant RC. FIG. 12B is a diagram expressing the description above. When "C" changes due to a disconnection in the cable and/or fallout of the antenna, the time constant RC changes, so that it is possible to detect the abnormality also by the method depicted in Embodiment 3. Namely, by supplying a DC voltage E (V) through a terminator of the coaxial cable from an outer side of the apparatus, and by measuring a time constant RC (second) from an electric current i (A) transiently flowing therethrough and comparing the time constant with a normal value, it is possible to verify the presence and absence of a disconnection in the cable, and connection states of the antenna and the coaxial cable from the outer side of the apparatus.

Note that, in the present invention, each of the embodiments can be freely combined, and each of them can be appropriately modified and/or eliminated without departing from the scope of the invention.

EXPLANATION OF NUMERALS AND SYMBOLS

Numeral "1" designates an electric apparatus frame; "2," "2a," "2b," microstrip antenna; "3," "3a," "3b," coaxial cable; "4," penetration terminal; "5," detection unit; "6," "6a," "6b," "6c," connector; "7," "7a," "7b," "7c," "7d," screw; "8," strip conductor; "9," dielectric material substrate; "10," ground plane; "11," "11a," "11b," "11c," "11d," outer conductor; "12," "12a," "12b," inner conductor; "13," dielectric material; "14," O-ring; and "15," cable support.

What is claimed is:

1. An antenna-and-cable connection-state verification device, comprising:
   an antenna mounted inside of an inner side of a frame of an electric apparatus, for receiving a signal generated due to partial discharge from the electric apparatus;
   a first coaxial cable connected to said antenna at a location inside of an inner side of the frame, for transmitting the signal received by said antenna;
   a second coaxial cable located outside of an outer side of the frame, for transmitting the signal received by said antenna;
   a penetration terminal attached on the frame to pass through the frame and connecting said first coaxial cable to said second coaxial cable, for transmitting the signal therethrough; and
   a detector to detect the signal received by said antenna by way of said first coaxial cable, said penetration terminal and said second coaxial cable, wherein,
   by measuring, on an outer side of the frame, a value of a combined capacitance of said antenna and said first coaxial cable mounted inside of an inner side of the frame, connection states of said antenna and said first coaxial cable are determined to be normal or abnormal based on the measured value of the combined capacitance of said antenna and said first coaxial cable.

2. The antenna-and-cable connection-state verification device as set forth in claim 1, wherein a plurality of groups of antennas are mounted at positions separated from one another inside of an inner side of the frame, and connection states of said antennas and said first coaxial cables are verified.

3. The antenna-and-cable connection-state verification device as set forth in claim 1, further comprising
   one or more cable supports mounted inside of an inner side of the frame in predetermined space-intervals, wherein
   said first coaxial cable is fixedly attached on the frame by the one or more cable supports, and connection states of said antenna and said first coaxial cable are verified.

4. The antenna-and-cable connection-state verification device as set forth in claim 1, wherein said antenna is a microstrip antenna.

5. The antenna-and-cable connection-state verification device as set forth in claim 1, wherein, by supplying an AC voltage through a terminator of said second coaxial cable or said penetration terminal at a predetermined frequency, and by comparing an electric current flowing therethrough with a normal value, connection states of said antenna and said first coaxial cable are verified from an outer side of the frame.

6. The antenna-and-cable connection-state verification device as set forth in claim 1, wherein, by supplying a DC voltage through a terminator of said second coaxial cable or said penetration terminal, and also by connecting a resistor and calculating a time constant of an electric current transiently flowing therethrough, connection states of said antenna and said first coaxial cable are verified from an outer side of the frame.

7. An antenna-and-cable connection-state verification method, using the antenna-and-cable connection-state verification device as set forth in claim 1, wherein connection states of said antenna and said first coaxial cable are verified from an outer side of the frame.

8. The antenna-and-cable connection-state verification device as set forth in claim 1, wherein said detector determines that one of said first coaxial cable or said second coaxial cable is disconnected based on measuring a total capacitance of said antenna, said first coaxial cable, and said second coaxial cable.

9. The antenna-and-cable connection-state verification device as set forth in claim 1, wherein said detector determines a location where one of said first coaxial cable or said second coaxial cable is disconnected based on measuring a total capacitance of said antenna, said first coaxial cable, and said second coaxial cable.

10. The antenna-and-cable connection-state verification device as set forth in claim 1, wherein said detector determines that one of said first coaxial cable or said second coaxial cable is disconnected based on measuring the total capacitance of said antenna, said first coaxial cable, and said second coaxial cable and comparing the total capacitance to an expected total capacitance of said antenna, said first coaxial cable, and said second coaxial cable.

* * * * *